US008247819B2

(12) United States Patent
Kim et al.

(10) Patent No.: US 8,247,819 B2
(45) Date of Patent: Aug. 21, 2012

(54) ORGANIC LIGHT EMITTING DIODE DISPLAY AND METHOD OF MANUFACTURING THE SAME

(75) Inventors: Eun-Ah Kim, Yongin (KR); Noh-Min Kwak, Yongin (KR); Soon-Ryong Park, Yongin (KR); Joo-Hwa Lee, Yongin (KR); Hee-Chul Jeon, Yongin (KR); Woo-Suk Jung, Yongin (KR); Hee-Seong Jeong, Yongin (KR); Chul-Woo Jeong, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 434 days.

(21) Appl. No.: 12/634,467

(22) Filed: Dec. 9, 2009

(65) Prior Publication Data

US 2010/0140649 A1 Jun. 10, 2010

(30) Foreign Application Priority Data

Dec. 10, 2008 (KR) .................. 10-2008-0125381

(51) Int. Cl.
*H01L 29/04* (2006.01)
(52) U.S. Cl. .............. 257/72; 257/59; 257/E51.018; 257/E51.019; 438/34; 438/99; 313/505

(58) Field of Classification Search .............. 257/40, 257/59, 72, E51.018, E51.019; 438/34, 42, 438/99, 149
See application file for complete search history.

(56) References Cited

U.S. PATENT DOCUMENTS 7,208,765 B2 * 4/2007 Yamazaki et al. .............. 257/72
7,544,534 B2 * 6/2009 Lee et al. ..................... 438/82

FOREIGN PATENT DOCUMENTS

| JP | 2004-513484 | 4/2004 |
|---|---|---|
| JP | 2007-173084 | 7/2007 |
| JP | 2007-265792 | 10/2007 |
| KR | 10-2004-0094057 | 11/2004 |
| KR | 10-2008-0016129 | 2/2008 |

* cited by examiner

*Primary Examiner* — David Vu
(74) *Attorney, Agent, or Firm* — Knobbe, Martens, Olson & Bear LLP

(57) ABSTRACT

An organic light emitting diode display includes a substrate member, a plurality of pixel electrodes formed on the substrate member, an organic emission layer formed on the pixel electrodes, and a first common electrode formed on the organic emission. A transmitting layer may be formed on the first common electrode and is configured to be substantially antireflective. A second common electrode may be formed on the transmitting layer and the first common electrode is electrically connected with the second common electrode.

19 Claims, 4 Drawing Sheets

ORGANIC LIGHT EMITTING DIODE DISPLAY AND METHOD OF MANUFACTURING THE SAME

CROSS-REFERENCE TO RELATED APPLICATION

This application claims priority to and the benefit of Korean Patent Application No. 10-2008-0125381 filed in the Korean Intellectual Property Office on Dec. 10, 2008, the entire contents of which are incorporated herein by reference.

BACKGROUND OF THE DISCLOSURE

1. Field of the Invention

The present disclosure relates to an organic light emitting diode display and a method of manufacturing the same. More particularly, the present disclosure relates to an organic light emitting diode display that improves visual perception by suppressing reflection of external light.

2. Description of the Related Art

Organic light emitting diode (OLED) displays include a plurality of organic light emitting diodes including a hole injection electrode, an organic light emission layer, and an electron injection electrode. The organic light emitting diode display forms an image by using light that is emitted. The light is emitted when an exciton created by combination of an electron and a hole in the organic emission layer drops from an exited state to a ground state.

Organic light emitting diode displays have self-light emitting characteristics and therefore do not need a light source. In contrast, liquid crystal displays require an external light source, which results in increased thickness and weight of the displays. Further, organic light emitting diode displays exhibit characteristics, such as low power consumption, high luminance, and high response speed. Therefore, OLED displays are often considered suitable displays for portable electronic devices.

In general, electrodes and metal wires included in organic light emitting diode displays reflect light traveling inside from the outside. Organic light emitting diode displays have difficulty in displaying black color and the contrast is deteriorated by the reflection of external light.

The above information disclosed in this background section is only for enhancement of understanding of the background of the disclosure and therefore it may contain information that does not form the prior art that is already known to a person of ordinary skill in the art.

SUMMARY OF THE DISCLOSURE

The present disclosure provides an organic light emitting diode display having improved visual perception by suppressing reflection of external light.

An aspect of the invention provides an organic light emitting diode display device comprising: a substrate member; a plurality of pixel electrodes formed on the substrate member; an organic emission layer formed on the plurality of pixel electrodes; a first common electrode formed on the organic emission; a transmitting layer formed on the first common electrode and configured to be substantially antireflective; and a second common electrode formed on the transmitting layer, wherein the first common electrode is electrically connected with the second common electrode.

In the foregoing display device, the transmitting layer comprises a plurality of common contact holes that may expose a portion of the first common electrode, wherein the second common electrode may be connected with the first common electrode through the common contact holes of the transmitting layer. The common contact holes of the transmitting layer may be disposed between the pixel electrodes. The display device may further comprise a pixel defining layer formed on the substrate member in between the plurality of pixel electrodes, wherein the first common electrode, the transmitting layer, and the second common electrode may be formed on the plurality of pixel electrodes and the pixel defining layer. The common contact holes of the transmitting layer may be formed in the pixel defining layer. At least one of the first common electrode and the second common electrode may be formed of a translucent layer. The translucent layer may comprise at least one of magnesium (Mg), silver (Ag), calcium (Ca), lithium (Li), chromium (Cr), and aluminum (Al).

The first common electrode may have a reflective index of about 0.5, e.g., 50%, or less. The thickness and refractive index of the transmitting layer may be determined by the formula, $d=\lambda/4nd\cos\theta$, wherein d is the thickness of the transmitting layer, $\lambda$ is wavelength of reflected light, n is the refractive index of the transmitting layer, and $\theta$ is an incident angle of light on the transmitting layer. The second common electrode may have a reflective index of about 0.3, e.g., 30%. The light emitted from the organic emission layer may not be substantially internally reflected by the first common electrode and the second common electrode.

Another aspect of the invention provides a method of manufacturing an organic light emitting diode display. The method may comprise: forming a plurality of pixel electrodes spaced apart on a substrate member; forming an organic emission layer on the pixel electrode; forming a first common electrode on the organic emission layer; forming a transmitting layer on the first common electrode; forming a plurality of common contact holes that expose a portion of the first common electrode in the transmitting layer; and forming a second common electrode on the transmitting layer to be connected with the first common electrode through the common contact holes.

The common contact holes of the transmitting layer may be disposed between the pixel electrodes. The method may further comprise forming a pixel defining layer between the plurality of pixel electrodes, wherein the first common electrode, the transmitting layer, and the second common electrode are formed on the plurality of pixel electrodes and the pixel defining layer. The common contact holes of the transmitting layer may be formed on the pixel defining layer. The common contact holes of the transmitting layer may be formed by a photolithography process. At least one of the first common electrode and the second common electrode may be formed of a translucent layer. The translucent layer may comprises at least one of magnesium (Mg), silver (Ag), calcium (Ca), lithium (Li), chromium (Cr), and aluminum (Al).

BRIEF DESCRIPTION OF THE DRAWINGS

The present disclosure will be described more fully hereinafter with reference to the accompanying drawings, in which embodiments of the disclosure are shown. In the Figures.

DETAILED DESCRIPTION OF THE EMBODIMENTS

Figure 1:
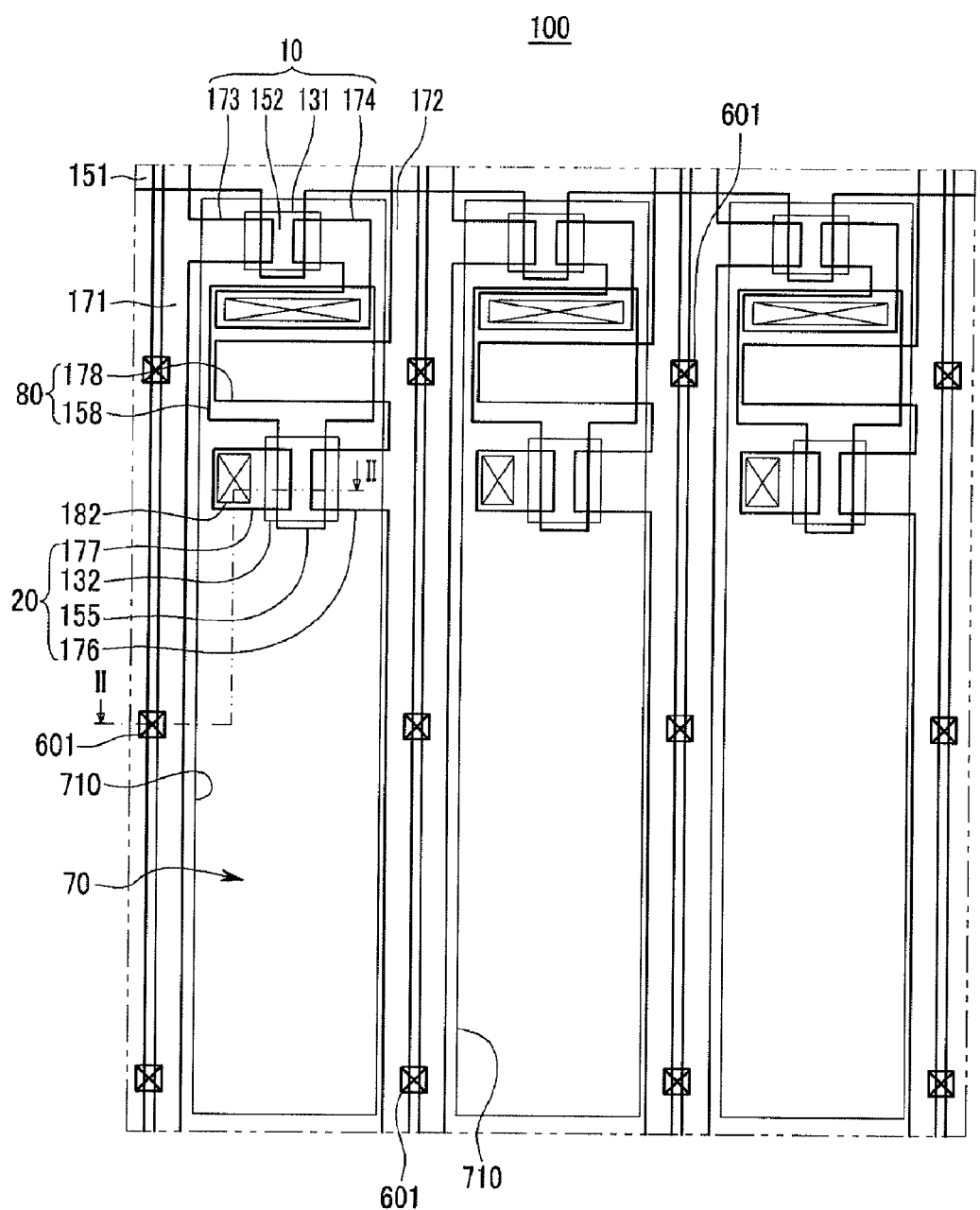
FIG. 1 is a layout view of an organic light emitting diode display according to an embodiment of the present disclosure.

Some embodiments of the present disclosure will now be described in detail with reference to the accompanying drawings so that those skilled in the art can easily achieve the present disclosure. As those skilled in the art will realize, the described embodiments may be modified in various different ways, all without departing from the spirit or scope of the present disclosure.

Further, the size and thickness of the elements shown in the drawings are for better understanding and ease of description, and the present disclosure is not necessarily limited thereto. Parts that are not important in the description are omitted in the drawings for clear description of the present disclosure, and like reference numerals designate like elements throughout the specification.

Further, in the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, although an active matrix (AM) type of organic light emitting diode display having a 2Tr-1Cap structure, which has two thin film transistors (TFT) and one capacitor for one pixel, is shown in the accompanying drawings, the present disclosure is not limited thereto. Accordingly, the organic light emitting diode display may have three or more thin film transistors and two or more capacitors for one pixel, and may be formed to have various structures by further forming specific wires. The pixel implies a minimum unit for displaying an image, and the organic light emitting diode display displays an image using a plurality of pixels.

An illustrated embodiment of the present disclosure is described with reference to FIG. 1 and FIG. 2. As shown in FIG. 1, an organic light emitting diode display 100 includes a switching thin film transistor 10, an activating thin film transistor 20, a capacitor 80, and an organic light emitting diode (OLED) 70 for each pixel. The organic light emitting diode display 100 further includes gate lines 151 arranged in one direction, data lines 171 insulating from and crossing the gate lines 151, and common power lines 172. In the above configuration, one pixel may be defined by the gate line 151, the data line 171, and the common power line 172. However, a pixel is not limited to the above definition.

According to the illustrated embodiment of FIG. 1, the switching thin film transistor 10 is activated by a gate voltage that is applied to the gate line 151 to transmit a data voltage, which is applied to the data line 171, and to the activating thin film transistor 20. A voltage corresponding to a difference between a common voltage applied through the common power line 172 to the activating thin film transistor 20 and the data voltage transmitted from the switching thin film transistor 10 is stored in the capacitor 80, and current corresponding to the voltage stored in the capacitor 80 flows to the organic light emitting diode 70 through the activating thin film transistor 20, such that the organic light emitting diode 70 emits light.

Light is emitted from an organic emission layer when an exiton is created. An exciton is created by a combination of the hole and electron injected drops from the exited state to the ground state. As a pixel electrode is formed for each pixel, the organic light emitting diode display 100 has a plurality of pixel electrodes spaced apart from each other.

Figure 2:
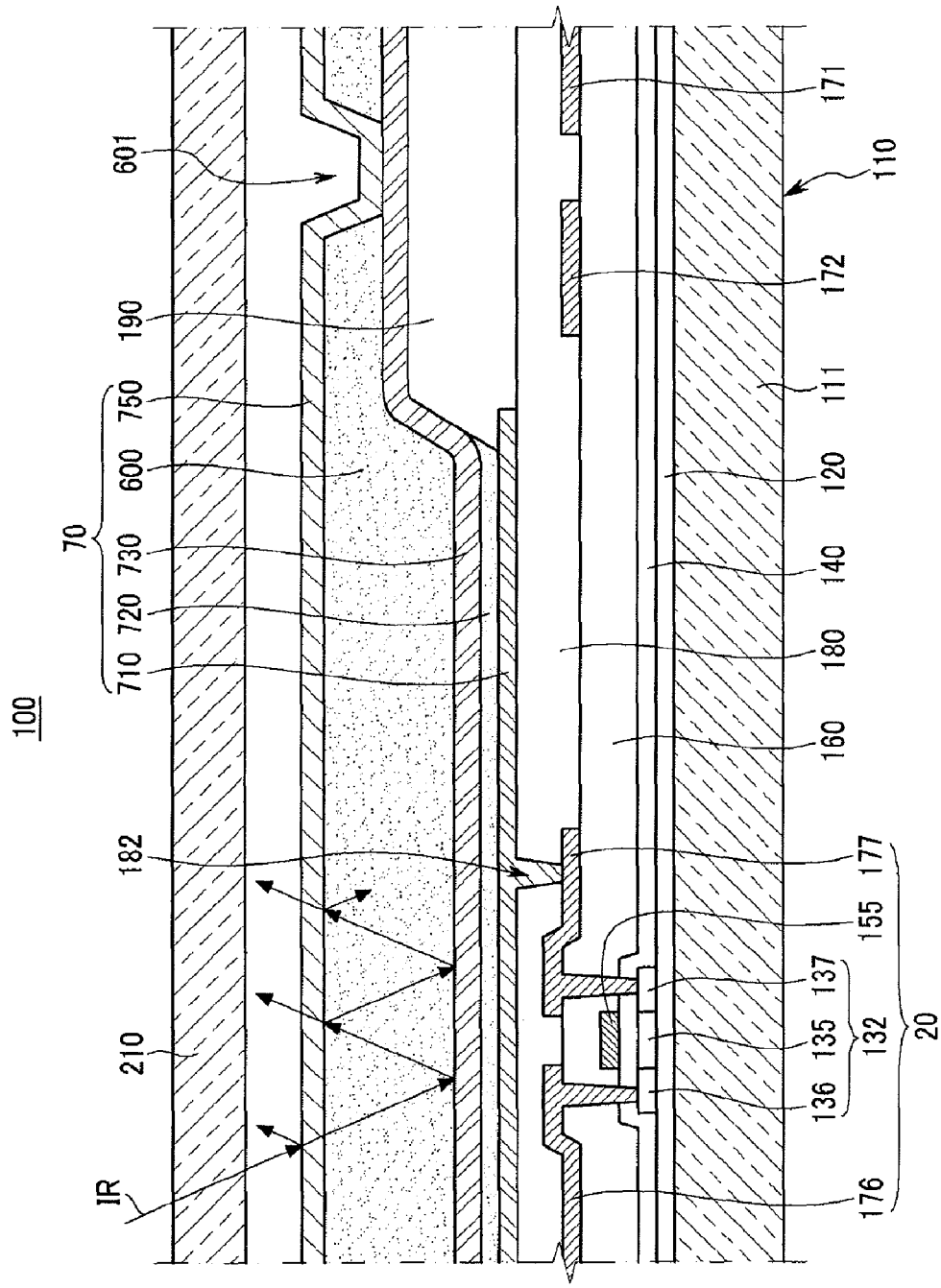
FIG. 2 is a cross-sectional view taken along the line II-II of FIG. 1.

The capacitor 80 includes a first capacitor plate 158 and a second capacitor plate 178 disposed across a gate insulating layer 140 (shown in FIG. 2).

The switching thin film transistor 10 is used as a switching element that selects a desired light-emitting pixel. The switching thin film transistor 10 includes a switching semiconductor layer 131, a switching gate electrode 152, a switching source electrode 173, and a switching drain electrode 174. The switching gate electrode 152 is connected to the gate line 151. The switching source electrode 173 is connected to the data line 171. The switching drain electrode 174 is disposed apart from the switching source electrode 173 and is connected with the first capacitor plate 158.

As shown in FIG. 2, the structure of the organic light emitting diode display 100 is illustrated in further detail. FIG. 2 shows the organic light emitting diode display 100, mainly in connection to the activating thin film transistor 20, the organic light emitting diode 70, and the capacitor 80.

A substrate member 111 is provided for the structure of the organic light emitting diode display 100. The substrate member 111 is formed of an insulating substrate, such as glass, quartz, ceramic, plastic, etc. However, embodiments of the present disclosure are not limited thereto. In some embodiments, the substrate member 111 is formed of a metallic substrate, such as stainless steel and etc.

A buffer layer 120 is formed on the substrate member 111. The buffer layer 120 prevents impurity elements from permeating and makes the surface flat, and can be made of various materials that can perform these functions. For example, any one of a silicon nitride (SiNx) film, a silicon oxide ($SiO_2$) film, and a silicon oxide-nitride (SiOxNy) film may be used as the buffer layer 120. However, in some embodiments, the buffer layer 120 is not imperative and may be excluded according to type of the substrate member 111 and process conditions.

In the illustrated embodiment of FIG. 2, the structure of a thin film transistor having an activating thin film transistor 20 is illustrated. Further, the switching thin film transistor 10 is described in relation to the difference from the activating thin film transistor 20.

The activating thin film transistor 20 applies activating power to the organic emission layer 720 of the organic light emitting diode 70 for emitting light in the selected pixel to the pixel electrode 710. The activating thin film transistor 20 includes an activating semiconductor layer 132, an activating gate electrode 155, an activating source electrode 176, and an activating drain electrode 177. The activating gate electrode 155 is connected with the first capacitor plate 158. The activating source electrode 176 and the second capacitor plate 178 are connected with the common power line 172, respectively. The activating drain electrode 177 is connected with the pixel electrode 710 of the organic light emitting diode 70 through a contact hole 182.

An activating semiconductor layer 132 of the activating thin film transistor 20 is formed on the buffer layer 120. The activating semiconductor layer 132 is formed of a polysilicon film. Further, the activating semiconductor layer 132 includes a channel region 135 where impurities are not doped, and a source region 136 and a drain region 137 where p+ impurities are doped at both sides of the channel region 135. In this configuration, the doped ion material is a P-type impurity such as boron (B), and $B_2H_6$ is mainly used. The impurity depends on type of thin film transistor. Although a thin film transistor having a PMOS structure using a P-type impurity is used as the activating thin film transistor 20 in some embodiments, the embodiments are not limited thereto. Thin film transistors having an NMOS or a CMOS structure may be used as the activating thin film transistor 20.

Although the activating thin film transistor 20 shown in FIG. 2 is a polycrystalline thin film transistor including a polysilicon film, the switching thin film transistor 10, which is not shown in FIG. 2, may be a polycrystalline thin film transistor or an amorphous thin film transistor including an amorphous silicon film.

A gate insulating layer 140 made of silicon nitride (SiNx) or silicon oxide ($SiO_2$) is formed on the activating semiconductor layer 132. A gate wire including the activating gate electrode 155 is formed on the gate insulating layer 140. The gate wire further includes the gate line 151 (shown in FIG. 1), the first capacitor plate 158 (shown in FIG. 1), and other wires. Further, the activating gate electrode 155 is formed to overlap at least a portion of the activating semiconductor layer 132, particularly the channel region 135.

An interlayer insulating layer 160 covering the activating gate electrode 155 is formed on the gate insulating layer 140. The gate insulating layer 140 and the interlayer insulating layer 160 have through-holes that expose the source region 136 and the drain region 137 of the activating semiconductor layer 132. The interlayer insulating layer 160, similar to the gate insulating layer 140, is formed of silicon nitride (SiNx) or silicon oxide ($SiO_2$).

Data wires including the activating source electrode 176 and activating drain electrode 177 are formed on the interlayer insulating layer 160. The data wires further include the data line (171, shown in FIG. 1), a common power line 172, the second capacitor plate 178, and other wires. Further, the activating source electrode 176 and the activating drain electrode 177 are respectively connected with the source region 136 and the drain region 137 of the activating semiconductor layer 132 through the through-holes.

As described in above embodiment, the activating thin film transistor 20 including the activating semiconductor layer 132, the activating gate electrode 155, the activating source electrode 176, and the activating drain electrode 177 is formed. The embodiments of the activating thin film transistor 20 are not limited and can be easily modified in various known configurations that can be easily achieved by those skilled in the art.

A planarization layer 180 that covers the data wires 172, 176, 177, and 178 is formed on the interlayer insulating layer 160. The planarization layer 180 provides a substantially planarized surface to increase luminous efficiency of the organic light emitting diode 70, which is formed thereon. Further, the planarization layer 180 has a contact hole 182 that exposes a portion of the drain electrode 177 of the activating thin film transistor 20. The planarization layer 180 is formed of at least one material of an acryl-based resin, an epoxy resin, a phenolic resin, a polyamide-based resin, a polyimide-base rein, an unsaturated polyester-based resin, a polyphenylene-based resin, a polyphenylenesulfide-based resin, and benzocyclobutene (BCB).

In the illustrated embodiment as shown in FIG. 2, the organic light emitting diode 70 is formed at least partially on the planarization layer 180. The organic light emitting diode 70 includes a pixel electrode 710, an organic emission layer 720 formed on the pixel electrode 710, and a common electrode 730 formed on the organic emission layer 720.

The pixel electrode 710 is formed on the planarization layer 180. The pixel electrode 710 is connected with the drain electrode 177 through a contact hole 182 of the planarization layer 180. As the pixel electrode 710 is formed for each pixel, the organic light emitting diode display 100 has a plurality of pixel electrodes 710 spaced apart from each other. The pixel electrode 710 is an anode (+), which is a hole injection electrode, and the common electrode 730 is a cathode (−), which is an electron injection electrode, in this configuration.

However, embodiments are not necessarily limited thereto, and the pixel electrode 710 may be the cathode while the common electrode 730 may be the anode, according to activating method of the organic light emitting diode display 100. The holes and electrons are injected into the organic emission layer 720, respectively from the pixel electrode 710 and the common electrode 730.

Light is emitted from the organic emission layer 720 when an exiton created by combination of the hole and electron injected drops from the exited state to the ground state. The organic emission layer 720 is made of a low molecular organic material or a high molecular organic material. The organic emission layer 720 is formed of multilayers including a hole injection layer (HIL), a hole transport layer (HTL), an emission layer, an electron transport layer (ETL), and an electron injection layer (EIL). The hole injection layer (HIL) is disposed on the pixel electrode 710, which is an anode, and the hole transport layer (HTL), the emission layer, the electron transport layer (ETL), and the electron injection layer (EIL) are sequentially disposed thereon.

In the illustrated embodiment as shown in FIG. 2, the organic light emitting diode display 100 further includes a pixel defining layer 190. The pixel defining layer 190 has an opening that exposes the pixel electrode 710 is formed on the planarization layer 180, and the pixel electrode 710 is formed at a position corresponding to the opening of the pixel defining layer 190. The pixel electrode 710 is disposed to correspond to the opening of the pixel defining layer 190. The organic emission layer 720 is formed on the pixel electrode 710 through the opening of the pixel defining layer 190, and the first common electrode 730 is formed on the pixel defining layer 190 and the organic emission layer 720. The pixel defining layer 190 may be made of a polyacryl-based resin, a polyimide-based resin, etc.

The organic light emitting diode 70 further includes a transmitting layer 600 formed on the common electrode 730 and an additional common electrode 750 formed on the transmitting layer 600. Hereinafter, the common electrode 730 is referred to as a first common electrode and the additional common electrode 750 is referred to as a second common electrode. In the illustrated embodiment as shown in FIG. 2, the first common electrode 730, the transmitting layer 600, and the second common electrode 750 are formed on the organic emission layer 720 and the pixel defining layer 190.

The transmitting layer 600 may be formed of an organic film or an inorganic film. An organic film is used as the transmitting layer 600 in the organic light emitting diode display 100 according to an embodiment of the present disclosure. Further, the transmitting layer 600 has an average thickness within an appropriate range. The thickness of the transmitting layer 600 is determined according to the refractive index of the transmitting layer 600.

Further, the transmitting layer 600 includes a plurality of common contact holes 601 that expose a portion of the first common electrode 730. The common contact holes 601 are formed at spaces between the plurality of pixel electrodes 710. That is, the common contact holes 601 are formed on the pixel defining layer 190. Further, the common contact holes 601 are uniformly distributed throughout the display area of the organic light emitting display 100. Accordingly, it is possible to prevent the common contact holes 601 from having an influence on the quality of an image displayed by the organic light emitting diode display 100.

Further, the common contact holes 601 are uniformly distributed in the display area of the organic light emitting diode display 100. In such embodiment, the display area implies a region where a pixel is formed and an image is practically displayed. Therefore, it is possible to suppress concentration of a voltage drop (IR drop) at a specific portion. In particular, it is possible to more effectively prevent the quality and uniformity of light emitted from the organic light emitting diode 70 from being reduced by the voltage drop (IR drop), by disposing the common contact holes 601 between the pixel electrodes 710.

The second common electrode 750 is formed on the transmitting layer 600. The second common electrode 750 is connected with the first common electrode 730 through the common contact holes 601 of the transmitting layer 600. Since the first common electrode 730 and the second common electrode 750 are connected through the common contact holes 601 of the transmitting layer 600, voltage drop (IR drop) between first common electrode 730 and the second common electrode 750 can be prevented.

The first common electrode 730 and the second common electrode 750 are formed of translucent layers. However, embodiments are not limited thereto. Either one of the first common electrode 730 and the second common electrode 750 may be formed of a translucent layer and the other may be transmitting type. The translucent layer used for the first common electrode 730 and the second common electrode 750 is made of at least one metal of magnesium (Mg), silver (Ag), calcium (Ca), lithium (Li), chromium (Cr), and aluminum (Al).

Further, the first common electrode 730 and the second common electrode 750 have appropriate reflective indexes to effectively discharge light created by the organic light emitting diode 70 and minimize reflection of light (IR) transmitted inside from the outside. For example, the first common electrode 730 may have a reflective index of about 0.5, e.g., about 50% or less, such as about 0.45, 0.4, 0.35, 0.3, etc. and the second common electrode 750 may have a reflective index of about 0.3, e.g., about 30%.

Further, the transmitting layer 600 is in contact with the first common electrode 730 and the second common electrode 750, at respective sides thereof That is, there is substantially no air or gap between transmitting layer 600 and the first common electrode 730 and second common electrode 750. The transmitting layer 600 should have an appropriate thickness and refractive index to effectively cause offset interference (e.g., destructive interference of light) by reflection of light between the first common electrode 730 and the second common electrode 750.

The thickness and refractive index of the transmitting layer 600 can be set by the following formula that is obtained from conditions of offset interference of light.

$$d = \lambda/4 \, nd \cos \theta \qquad \text{Formula 1}$$

Herein, d is the distance between two reflecting surfaces, such that d is the distance between the first common electrode 730 and the second common electrode 750, and is also the thickness of the transmitting layer 600. n is the refractive index of the transmitting layer 600, $\theta$ is an incident angle of light, and $\lambda$ is the wavelength of the reflected light.

The wavelength of visible light and the refractive index of the material used as the transmitting layer 600 are substituted into the above formula. By assuming that the average incident angle of the external light is about 30 degrees to 45 degrees, the average thickness that the transmitting layer 600 can be calculated. According to the kind of the material used as the transmitting layer 600, the transmitting layer 600 may have an appropriate thickness. In contrast, to achieve a desired thickness of the transmitting layer 600, the transmitting layer 600 may be formed of a material having an appropriate refractive index.

According to the illustrated embodiment as shown in FIG. 2, the light (IR radiation) traveling to the first common electrode 730 through the second common electrode 750 from outside is partially reflected on the first common electrode 730 and then travels to the second common electrode 750. A portion of the light traveling to the second common electrode 750 is discharged outside through the second common electrode 750, and the remaining light is reflected again and travels to the first common electrode 730. As described above, a majority of the light traveling inside from outside is extinguished by the offset interference while being repeatedly reflected between the first common electrode 730 and the second common electrode 750 through the transmitting layer 600. Therefore, the organic light emitting diode display 100 can improve visual perception by suppressing reflection of external light.

Furthermore, since the first common electrode 730 and the second common electrode 750 are connected with each other through the common contact holes 601 of the transmission film 600, voltage drop (IR drop) between the first common electrode 730 and the second common electrode 750 can be prevented.

The common contact holes 601 are uniformly distributed throughout the display area, such that it is possible to prevent voltage drop (IR drop) from being concentrated at a specific portion. In particular, it is possible to more effectively prevent the quality and uniformity of light emitted from the organic light emitting diode 70 from being reduced by the voltage drop (IR drop), by disposing the common contact holes 601 between the pixel electrodes 710.

Since the common contact holes 601 of the transmitting layer 600 are formed between the pixel electrodes 710 on the pixel defining layer 190, it is possible to prevent the common contact holes 601 from having an influence on the quality of an image displayed by the organic light emitting diode display 100.

In some embodiments, the first common electrode 730 and the second common electrode 750 are formed as translucent types. However, embodiments of the organic light emitting diode display 100 are not limited thereto. Therefore, either one of the first common electrode 730 and the second common electrode 750 can be formed as a transmitting type. Meanwhile, the pixel electrode 710 is formed as any one of a transmitting type, a translucent type, and a reflective type.

According to the kinds of the materials for the pixel electrode 710, the first common electrode 730, and the second common electrode 750, the organic light emitting diode display 100 may be a front light emitting type, a rear light emitting type, or a both-side light emitting type. Meanwhile, in the illustrated embodiment as shown in FIG. 2, the organic light emitting diode display 100 is formed as a front light emitting type. That is, the organic light emitting diode 70 displays an image by emitting light to the first common electrode 730 and the second common electrode 750 direction.

As a transparent conductive material of the organic light emitting diode display 100, indium tin oxide (ITO), indium zinc oxide (IZO), zinc oxide (ZnO), or indium oxide ($In_2O_3$) can be used. As a reflective material of the organic light emitting diode display 100, lithium (Li), calcium (Ca), lithium fluoride/calcium (LiF/Ca), lithium fluoride/aluminum (LiF/Al), aluminum (Al), silver (Ag), magnesium (Mg), gold (Au), etc., can be used.

In the illustrated embodiment as shown in FIG. 2, the organic light emitting diode display 100 includes a sealing member 210. The sealing member 210 is disposed on the organic light emitting diode 70. The sealing member 210 is disposed to face the substrate member 111 and covers the thin film transistor 20 and the organic light emitting diode 70. The sealing member 210 is bonded and forms a seal with the substrate member 111. The sealing member 210 seals and covers the thin film transistors 10 and 20 and the organic light emitting diode 70 formed on the substrate member 111 to protect them from external moisture and air. In the embodiment, the elements except for the sealing member 210 are referred to as a display substrate 110. An insulation substrate generally made of glass or plastic may be used as the sealing member 210. As described above, the organic light emitting diode display 100 can improve visual perception by suppressing reflection of external light, using the first common electrode 730, the transmitting layer 600, and the second common electrode 750.

Figure 3:
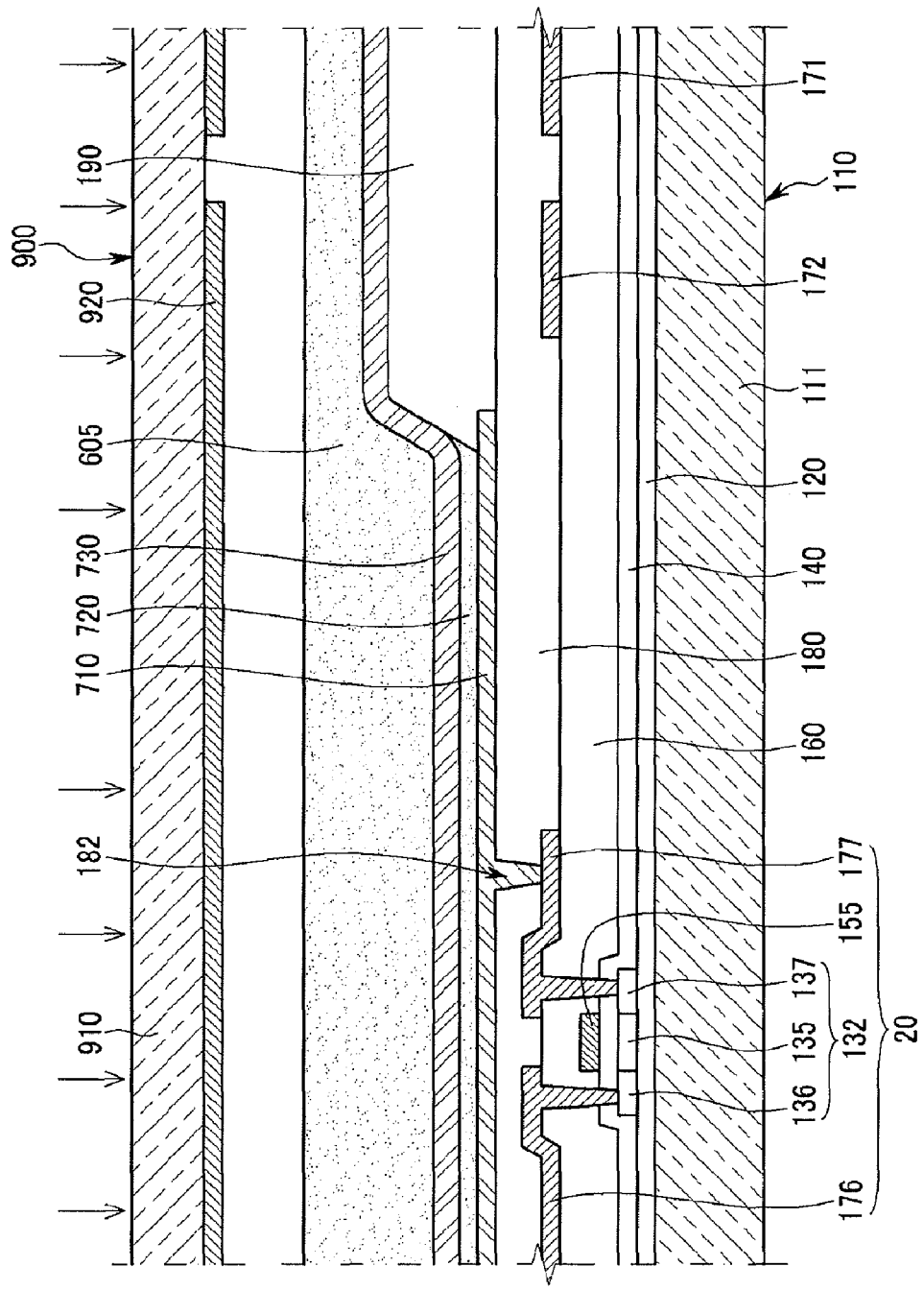
FIG. 3 and FIG. 4 are cross-sectional views sequentially illustrating a manufacturing process of the organic light emitting diode display of FIG. 1.
Figure 4:
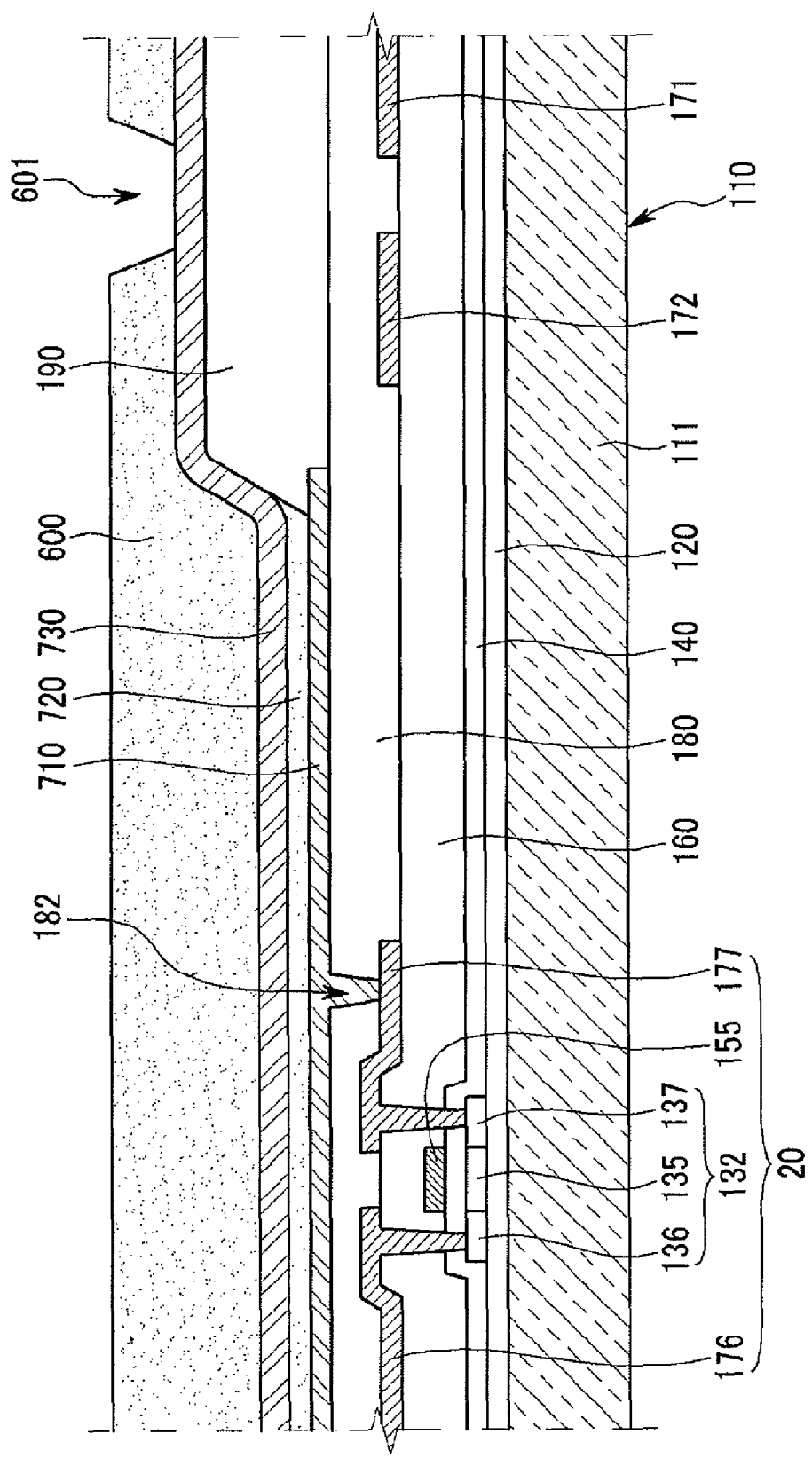

In the illustrated embodiment as shown in FIG. 3 and FIG. 4, a method of manufacturing the organic light emitting diode display 100 is provided.

In the illustrated embodiment as shown in FIG. 3, the thin film transistor 20, the pixel defining layer 190, the pixel electrode 710, the organic emission layer 720, and the first common electrode 730 are formed on the substrate member 111. Further, a photosensitive organic material 605 is applied onto the first common electrode 730. Thereafter, a photolithography process is performed using a mask 900. The mask 900 includes a mask substrate 910 and a light shield pattern 920 formed on the mask substrate 910. The exposure portion of the photosensitive organic material 605 is removed and the non-exposure portion remains after the photolithography process. On the contrary, the exposure portion may remain and the non-exposure portion may be removed, depending on the kind of the organic material 605.

In the illustrated embodiment as shown in FIG. 4, the transmitting layer 600 having the common contact holes 601 is formed by hardening the photosensitive organic material 605 remaining after the photolithography process. In this process, the transmitting layer 600 is provided with an appropriate refractive index and thickness according to the above Formula 1. Subsequently, the second common electrode 750 is formed on the transmitting layer 600, and then sealed with the sealing member 210.

In this illustrated embodiment, at least one of the first common electrode 730 and the second common electrode 750 is a translucent layer formed of magnesium (Mg), silver (Ag), calcium (Ca), lithium (Li), chromium (Cr), or aluminum (Al).

According to the manufacturing method, it is possible to manufacture an organic light emitting diode display having improved visual perception by suppressing reflection of external light.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light emitting diode display, comprising:
    a substrate member;
    a plurality of pixel electrodes formed on the substrate member;
    an organic emission layer formed on the plurality of pixel electrodes;
    a first common electrode formed on the organic emission;
    a transmitting layer formed on the first common electrode and configured to be substantially antireflective; and
    a second common electrode formed on the transmitting layer, wherein the first common electrode is electrically connected with the second common electrode.

2. The organic light emitting diode display of claim 1, wherein the transmitting layer comprises a plurality of common contact holes that expose a portion of the first common electrode.

3. The organic light emitting diode display of claim 2, wherein the second common electrode is connected with the first common electrode through the common contact holes of the transmitting layer.

4. The organic light emitting diode display of claim 1, wherein the common contact holes of the transmitting layer are disposed between the pixel electrodes.

5. The organic light emitting diode display of claim 1, further comprises a pixel defining layer formed on the substrate member in between the plurality of pixel electrodes, wherein the first common electrode, the transmitting layer, and the second common electrode are formed on the plurality of pixel electrodes and the pixel defining layer.

6. The organic light emitting diode display of claim 5, wherein the common contact holes of the transmitting layer are formed in the pixel defining layer.

7. The organic light emitting diode display of claim 1, wherein at least one of the first common electrode and the second common electrode is formed of a translucent layer.

8. The organic light emitting diode display of claim 7, wherein the translucent layer comprises at least one of magnesium (Mg), silver (Ag), calcium (Ca), lithium (Li), chromium (Cr), and aluminum (Al).

9. The organic light emitting diode display of claim 1, wherein the first common electrode has a reflective index of about 0.5 or less.

10. The organic light emitting diode display of claim 1, wherein the thickness and refractive index of the transmitting layer is determined by the formula $$d = \lambda/4\, nd \cos\theta,$$

wherein d is the thickness of the transmitting layer, $\lambda$ is wavelength of reflected light, n is the refractive index of the transmitting layer, and $\theta$ is an incident angle of light on the transmitting layer.

11. The organic light emitting diode display of claim 1, wherein the second common electrode has a reflective index of about 0.3.

12. The organic light emitting diode display of claim 1, wherein the light emitted from the organic emission layer is not substantially internally reflected by the first common electrode and the second common electrode.

13. A method of manufacturing an organic light emitting diode display, the method comprising:
    forming a plurality of pixel electrodes spaced apart on a substrate member;
    forming an organic emission layer on the pixel electrode;
    forming a first common electrode on the organic emission layer;
    forming a transmitting layer on the first common electrode;
    forming a plurality of common contact holes that expose a portion of the first common electrode in the transmitting layer; and
    forming a second common electrode on the transmitting layer to be connected with the first common electrode through the common contact holes.

14. The method of claim 13, wherein the common contact holes of the transmitting layer are disposed between the pixel electrodes.

15. The method of claim 13, further comprises forming a pixel defining layer between the plurality of pixel electrodes, wherein the first common electrode, the transmitting layer, and the second common electrode are formed on the plurality of pixel electrodes and the pixel defining layer.

16. The method of claim 15, wherein the common contact holes of the transmitting layer are formed on the pixel defining layer.

17. The method of claim 13, wherein the common contact holes of the transmitting layer are formed by a photolithography process.

18. The method of claim 13, wherein at least one of the first common electrode and the second common electrode is formed of a translucent layer.

19. The method of claim 18, wherein the translucent layer comprises at least one of magnesium (Mg), silver (Ag), calcium (Ca), lithium (Li), chromium (Cr), and aluminum (Al).

* * * * *